US011926522B1

(12) United States Patent
Huff

(10) Patent No.: US 11,926,522 B1
(45) Date of Patent: Mar. 12, 2024

(54) PACKAGING OF MICROFLUIDIC DEVICES AND MICROFLUIDIC INTEGRATED SYSTEMS AND METHOD OF FABRICATION

(71) Applicant: CORPORATION FOR NATIONAL RESEARCH INITIATIVES, Reston, VA (US)

(72) Inventor: Michael A. Huff, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 23 days.

(21) Appl. No.: 17/719,045

(22) Filed: Apr. 12, 2022

(51) Int. Cl.
*B81B 7/00* (2006.01)
*B81C 1/00* (2006.01)

(52) U.S. Cl.
CPC .......... *B81B 7/007* (2013.01); *B81C 1/00301* (2013.01); *B81B 2201/0264* (2013.01); *B81B 2201/054* (2013.01); *B81B 2207/092* (2013.01); *B81B 2207/095* (2013.01); *B81B 2207/096* (2013.01); *B81C 2203/019* (2013.01)

(58) Field of Classification Search
CPC ............ B81B 7/007; B81B 2201/0264; B81B 2201/054; B81B 2207/092; B81C 1/00301
See application file for complete search history.

(56) References Cited

U.S. PATENT DOCUMENTS

2007/0060970 A1* 3/2007 Burdon ................... H01L 23/10
607/37

* cited by examiner

*Primary Examiner* — Samuel A Gebremariam
(74) *Attorney, Agent, or Firm* — Nixon & Vanderhye, P.C.

(57) ABSTRACT

A package and method of packaging for integrated microfluidic devices and systems is disclosed wherein a package is made from individually processed and patterned layers of LTCC green tape, that is aligned and stacked, and then co-fired to form a stable LTCC ceramic packaging modules. Subsequently, microfluidic device die and/or integrated microfluidic systems device die are bonded to pre-determined areas of the packaging modules and the modules are aligned bonded together to form leak-free, sealed packages for the microfluidic devices and systems. The use of LTCC materials and techniques provides a low-cost flexible and easily customizable packaging approach for microfluidic devices and systems that can be designed and transitioned into production with significant development time and cost.

13 Claims, 12 Drawing Sheets

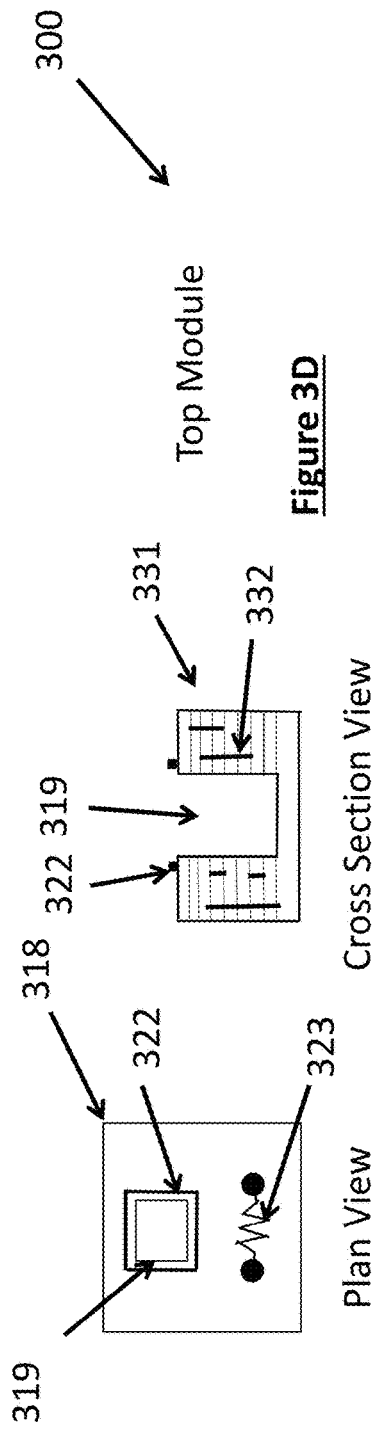
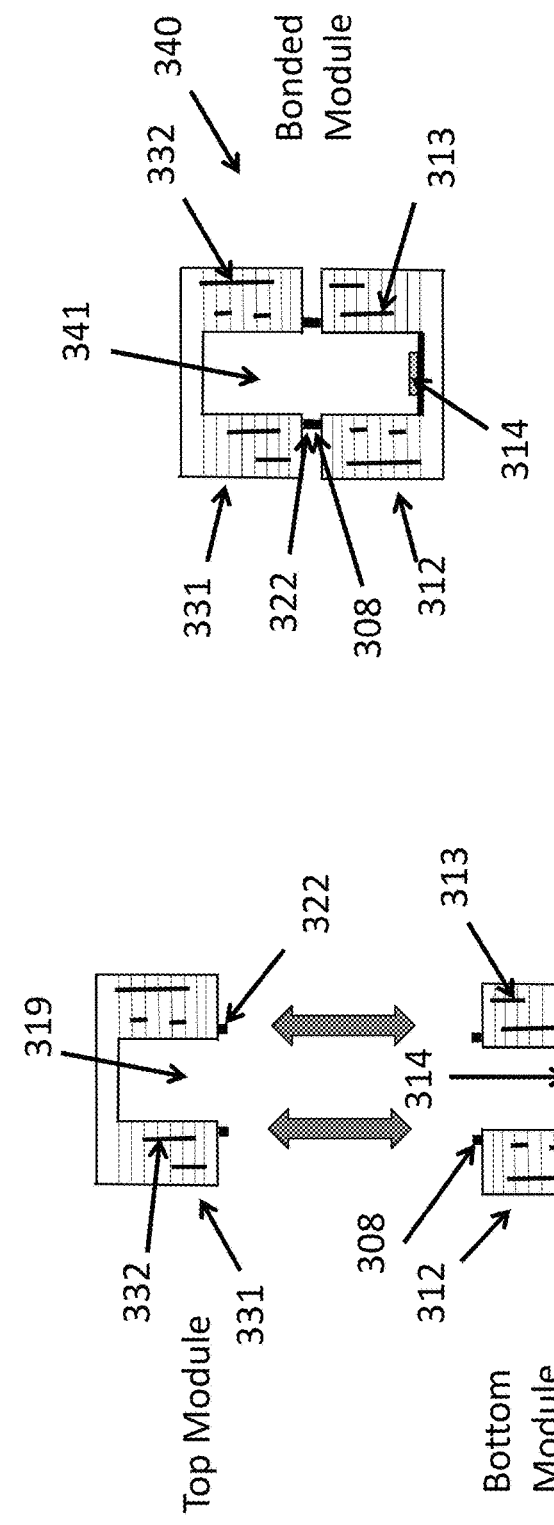

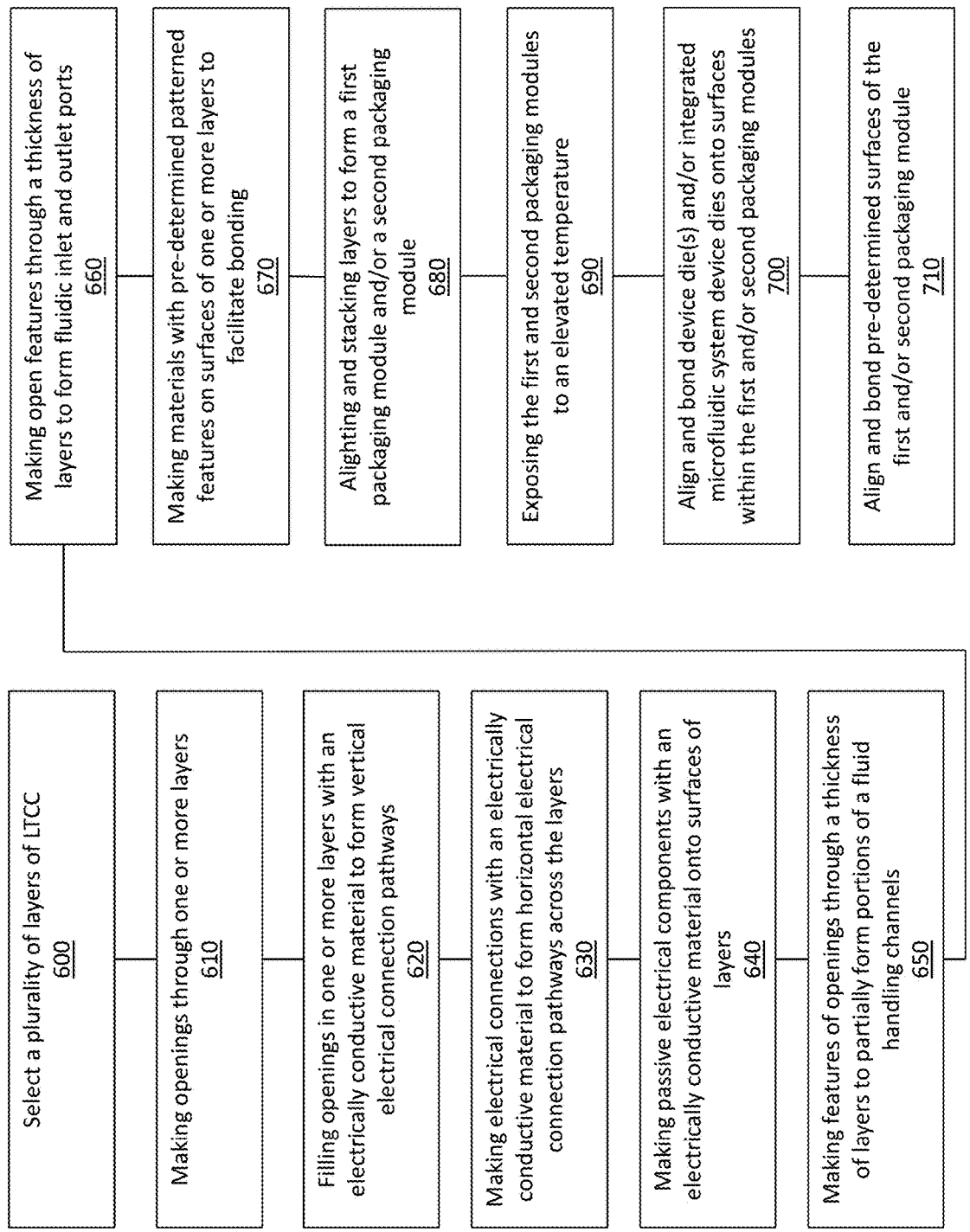

PACKAGING OF MICROFLUIDIC DEVICES AND MICROFLUIDIC INTEGRATED SYSTEMS AND METHOD OF FABRICATION

This invention was made with government support under FA8651-16-C-0258 awarded by the Air Force. The government has certain rights in the invention.

FIELD OF INVENTION

The present invention is directed to the packaging of micro-scale microfluidic devices and systems. Specifically, the packaging individual microfluidic devices and the packaging of a microfluidic system composed of a micromachined, micro-scale 3-way microvalve integrated to a micro-scale pressure sensor and electronics die is disclosed. The packaging design and methods disclosed in the present invention integrated provides the distinct and important advantages of flexibility, low-cost, high performance and reliability. For certain system configurations it also offers additional advantages such as faster pneumatic response due to the significant reduction in the pneumatic capacitance of the system. This present invention has a wide range of applications including medical, industrial control, aerospace, automotive, consumer electronics and products, as well as any application(s) requiring the use of packaging for microfluidic elements of any type including valves, pumps, restrictors, mixers, reaction chambers, and sensors for the control, measurement and monitoring of fluids.

BACKGROUND

Fluidic systems are often composed of a variety of fluidic components, including valves, pumps, flow resistors, pressure sensors, mixers, etc. Fluidic systems can be implemented at the macroscale and the microscale. Fluidic systems implemented at the microscale are often called "microfluidic systems." Most often, microfluidic components are implemented using semiconductor manufacturing methods that are composed of a sequentially performed set of processing steps on substrates. The substrates are usually made of single-crystal silicon, but can be made from other semiconductors as well as glass, ceramic, plastic, or metal. In general, the fabrication process sequences for implementing microfluidic systems are often highly customized for each component. For example, the fabrication process for a microvalve is likely to be vastly different from the fabrication process for a micro-pressure sensor and both will be vastly different from the fabrication process used to make an integrated electronic circuit. The design details will be different, the functionality is different and the process steps used in the fabrication process sequence will be very different.

As a result of the customization of microfluidic components, significant challenges are presented with regard to packaging of these types of devices and systems. In general, the packaging of any micro- or nano-device (herein no distinction is made between devices at the micro-scale of the nano-scale due to the dimensions of the devices or the dimensions of the devices critical features, and therefore the term "microfluidic devices and systems" will be deemed to apply to any device or system at either the microscale or the nanoscale) is been a very challenging endeavor, but microfluidic device packaging presents unique issues.

There are a number of reasons that make packaging of microfluidic devices and systems very challenging. First, the package needs to protect the microfluidic device or systems from any damage or alteration of its performance from the environment it is immersed in while at the same time allow the microfluidic devices or systems to interact with the environment. Second, the package must provide no leakage between the package and the microfluidic devices or systems within the package. Third, the package must provide for the ability to make leak-free fluidic connections to the package and the microfluidic devices or systems encapsulated within the package. Fourth, the package usually must provide the ability for other types of connectivity, such as electrical signals between the outside world and the microfluidic devices or systems within the package. Fifth, the package must not introduce any effects that could alter the enclosed microfluidic devices or systems in any way. An important example of such an effect would be the introduction of packaging stresses to the microfluidic devices or systems, such as when the thermal expansion coefficient of the microfluidic devices or systems materials were substantially different from the thermal expansion coefficients of the materials of the package. Sixth, the package must be low in cost, highly reliable, and manufacturable. Seventh, the technology of the package preferably would be easy to customize for a specific microfluidic devices or system without incurring significant costs and development times.

These challenges associated with packaging of microfluidic devices or systems have represented an enormous barrier to the commercialization of these types of devices and systems. The present invention is directed at a solution to one or more of these and/or other challenges of packaging of microfluidic devices and systems.

SUMMARY OF INVENTION

Examples of the present disclosure are directed to the packaging of micro-scale microfluidic devices and systems. Specifically, the packaging individual microfluidic devices and the packaging of a microfluidic system composed of a micromachined, micro-scale 3-way microvalve integrated to a micro-scale pressure sensor and electronics die is disclosed. The packaging design and methods disclosed provide the distinct and important advantages of flexibility, low-cost, high performance and reliability. For certain system configurations it also offers additional advantages such as faster pneumatic response due to the significant reduction in the pneumatic capacitance of the system. Example embodiments have a wide range of applications including medical, industrial control, aerospace, automotive, consumer electronics and products, as well as any application(s) requiring the use of packaging for microfluidic elements of any type including valves, pumps, restrictors, mixers, reaction chambers, and sensors for the control, measurement and monitoring of fluids.

BRIEF DESCRIPTION OF THE DRAWINGS

FIGS. 3A to 3F are cross sectional illustrations of a complete enclosure for a die or dies according to an example of the present technology.

FIG. 6 illustrates steps of a method for fabrication a package for a microfluidic device or system made of a plurality of individually patterned layers of low-temperature co-fired ceramic (LTCC) material.

DETAILED DESCRIPTION OF THE INVENTION

Figure 1:
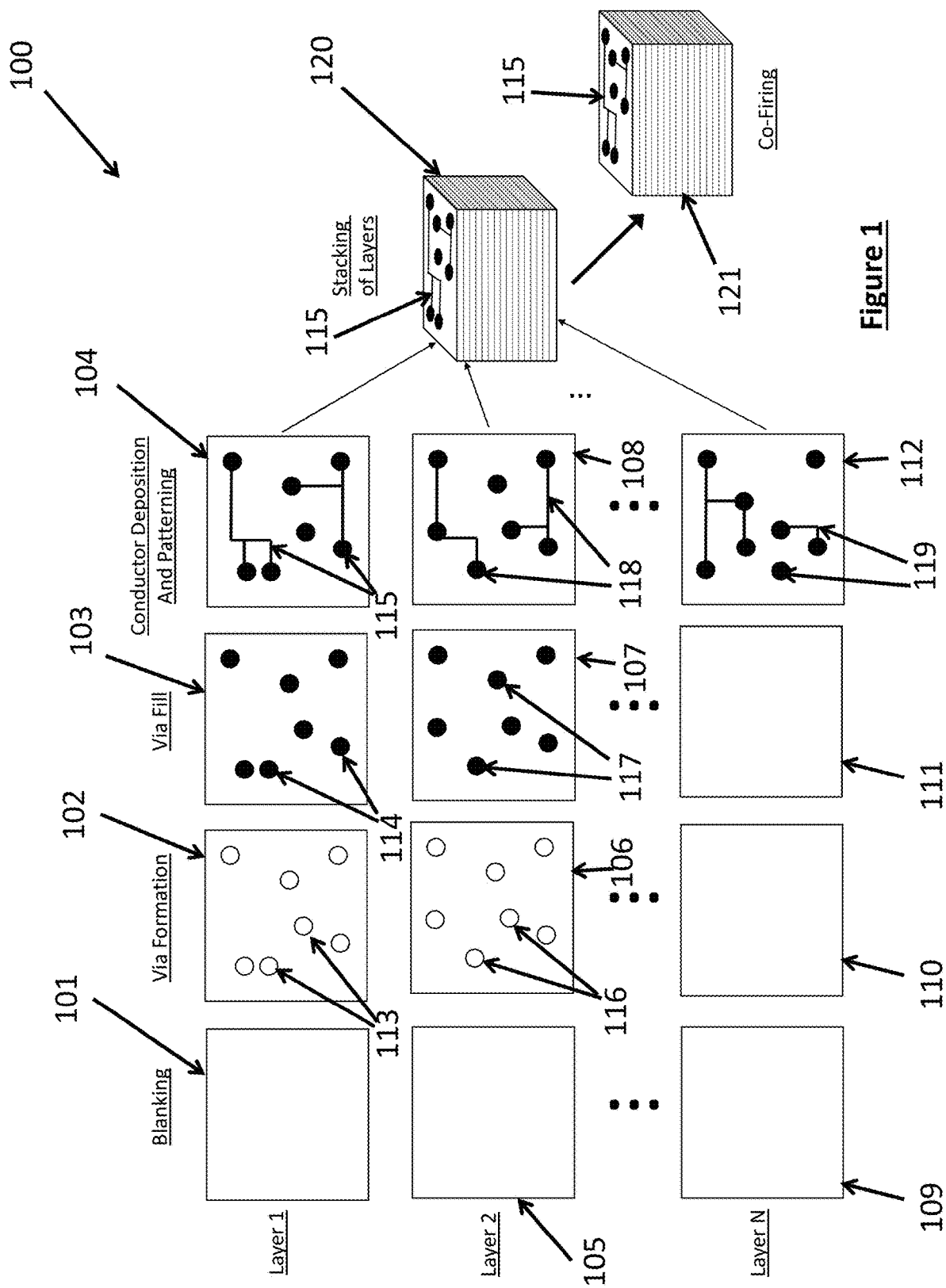
FIG. 1 illustrates the processing method of low-temperature co-fired ceramic (LTCC) to construct composite ceramic modules containing multilayer stacks of circuits according to an example of the present technology.

Examples of the present disclosure are directed to the packaging of micro-scale microfluidic devices and systems. Specifically, the packaging individual microfluidic devices and the packaging of a microfluidic system composed of a micromachined, micro-scale 3-way microvalve integrated to a micro-scale pressure sensor and electronics die is disclosed. The packaging design and methods disclosed in the present invention integrated provides the distinct and important advantages of flexibility, low-cost, high performance and reliability. For certain system configurations it also offers additional advantages such as faster pneumatic response due to the significant reduction in the pneumatic capacitance of the system. Examples of the present technology have a wide range of applications including medical, industrial control, aerospace, automotive, consumer electronics and products, as well as any application(s) requiring the use of packaging for microfluidic elements of any type including valves, pumps, restrictors, mixers, reaction chambers, and sensors for the control, measurement and monitoring of fluids.

Some examples of the present technology provide a solution to the challenges associated with packaging of microfluidic devices and systems including: it protects the microfluidic device or systems from any damage or alteration of its performance from the environment it is immersed in while at the same time allow the microfluidic devices or systems to interact with the environment; it provides no leakage between the package and the microfluidic devices or systems within the package; it provides for the ability to make leak-free fluidic connections to the package and the microfluidic devices or systems encapsulated within the package; it provides the ability for other types of connectivity, such as electrical signals between the outside world and the microfluidic devices or systems within the package; it does not introduce any effects that could alter the enclosed microfluidic devices or systems in any way since it thermal expansion coefficient matches that of the materials used to implement the microfluidic devices and systems; it is very low in cost, highly reliable, and manufacturable; and/or the package technology is easily customizable for a specific microfluidic devices or system without incurring significant costs and development times.

Examples of the present disclosure are based on the use of low-temperature co-fired ceramic (LTCC) technology for the packaging of microfluidic devices and systems. The basic concept of LTCC is that highly complex and functional structures can be implemented from the stacking of thin layers individually processed and patterned layers of a malleable ceramic material layer called "green tape", followed by the aligned stacking of these individual processed and patterned layers, and then firing (i.e., exposing to an elevated temperature for a pre-determined period of time and temperature) the stacked ensemble of layers to transition the green tape to a hard ceramic material thereby forming the composite structure containing passive components, pathways, electrical connections, through-layer openings or vias, through-layer electrically conductive vias, and/or mounted active devices, and/or various interfaces on the surfaces for electrical and other means of connectivity to the internally encapsulated elements.

The individual layers are composed of a material called "green tape" that lends itself to easy to a diverse set of processing and patterning methods. The green tape layers are composed of a material that once fired has excellent performance properties, including stability, reliability, a thermal expansion coefficient nearly equal to silicon, low microwave electromagnetic loss factors, non-permeable to liquids and most gases, long-term stability, good thermal properties, good electrical insulation properties, and more.

Green tape has a uniform thickness and can be cut into any shape and size, and patterned before firing. Through-layer holes or other pre-determined shapes can easily be made in the green tape. These through-layer openings can be used to make fluid flow channels in the horizontal directions as well as in the vertical direction in the stacked ensembles. Through-layer holes can also be filled with a conductive material to make thought-layer electrical via connections. The surface of the green tape can be processed by screen-printing pre-defined patterned layers of conductive materials such as gold, copper, silver, etc. to form electrical connections and electrical passive components, such as resistors, capacitors and inductors, as well as areas for the surface mounting of active elements.

After firing, the composite layers can be further processed, including the mounting of active devices (e.g., electrical active devices including diodes, transistors, LEDs, etc; MEMS devices, such as inertial sensors, pressure and force sensors, actuators, etc.; and microfluidic devices and systems such as microvalves, micropumps, etc). Typically, these active devices would be implemented onto substrates such as silicon, glass, or some type of semiconductor material and then mounted onto the LTCC using a conductive paste or a thermo-compression bonding method.

The fired LTCC material can also be machined, such as drilling holes or making of fluid channels. The fired LTCC can be polished to a low level of surface roughness and then processed to make active devices directly onto the surfaces of the material such as micromechanical elements including switches and valve elements. The fired LTCC can be made into standard substrate sizes and processed using standard semiconductor fabrication equipment such as thin-film layer depositions, photolithography, and etching.

Moreover, the after stacked layers of fired LTCC have been processed, such as the mounting of active elements onto the surfaces, separate pieces of the fired and processed LTCC can be bonded together using thermo-compression bonding methods to encapsulate the active elements as well as make fluidic containing pathways through the structure.

The use of LTCC with the wide array of processing and patterning techniques available make it an extremely adaptable, flexible, rapidly developed, and low-cost solution for packaging.

An advantage of the LTCC technology is the ability of stacking multiple dielectric layers, wherein each layer can have individually patterned metallic circuits formed on the surfaces, which can then be placed on top of one another and with high quality interlayer connections, so as to form 3-Dimensional circuit implementations. The metallic conductors on the various layers of LTCC can be interconnected using metallic filled vias with considerable ease. Interlayer vias made in LTCC display excellent electrical conductivity. LTCC technology enables fifty (50) or more individual layers of LTCC material, each of which can have a unique circuit fabricated on the surface, to be stacked up and fired together to embody extremely complex 3-D circuits.

FIG. 1 illustrates the processing method embodiment 100 of LTCC to construct composite ceramic modules 120 containing multilayer stacks of circuits. The LTCC green tape is first cut into blanks 101, 105, . . . 109 using a process called blanking (Note: only the series of processing steps for three blanks are directly illustrated in FIG. 1, but the symbol " . . . " is used to indicate that there may be more than three blanks involved in the processing of the blanks, and in fact, there may be tens of blanks involved in the processing of the blanks). Each of the individual N blank layers can be processed and patterned differently.

Typically, the different blank layers will have the same thickness, shape and size, although different thicknesses shapes and sizes can be accommodated as well in LTCC processing. Next, patterns of opening or via features 113 and 116 are made into these blank 102 and 106 layers to form openings or vias according to a pre-determined pattern. These opening or via features 113 and 116 are made completely through the blank layer 102 and 106 thicknesses and the features 113 and 116 from one blank layer 102 and 106 to another may differ. These opening or via features 113 and 116 can be in many sizes and shapes.

Subsequently, some pre-determined pattern of the opening or via features 113 and 116 are filled to provide filled vias 114 and 117 with a metallic electrical conductive material, usually a gold, silver or copper paste. Next, a pre-determined pattern of electrically conductive interconnects 115, 118, and . . . 119 are screen-printed onto the surfaces of the blanks 104, 108 and . . . 112. The pattern of these electrical interconnects 115, 118, and . . . 119 may differ from one blank 104, 108, and . . . 112 to another. As noted in FIG. 1, each processed blank 104, 108 and, . . . 112 may have a different pattern of filled vias 114, and 117 and electrical interconnects 115, 118, and . . . 119. The processed blanks 104, 108, and . . . 112 are then aligned and stacked or laminated together to form a composite element or module 120 of LTCC green tape.

If the processed blanks are composed of individual elements, the blanks may be green cut. This is typically a partial cutting process that does not extend through the thickness of the blank. Green cutting is not shown in FIG. 1.

Lastly, the stacked or laminated blanks forming a composite module 120 are then co-fired into a composite module 121. The co-firing 121 is an elevated temperature exposure of the stacked or laminated blanks (e.g., composite module 120) that results in a curing of the blanks wherein the green tape transitions from a malleable material to a harden ceramic material. Additionally, the co-firing 121 results in the filled vias 114, 117, . . . to make good electrical connections to the vias 114, 117, . . . in other blanks and to make good electrical connection from the vias 114, 117, . . . to the patterned conductive interconnects 115, 118, and . . . 119 printed onto the surfaces of the blank 104, 108, and . . . 112 when these elements align to one another in the stacked layers.

The co-fired element 121 may then be separated into the individual smaller elements using a process called singulation. Alternatively, the co-fired blanks may be sawed into individual smaller elements. Alternatively, the processed ceramic modules 121 can be used as is.

With the completed co-fired ceramic module 121, various passive and active electrical components can then made into or mounted onto the surface(s) of the module 121. This may include integrated circuits, both unpackaged as well as in surface mount packages, as well as discrete devices. This will be described in more detail below. Typically, the co-fired composite module 121 will have areas of patterned electrically conductive 115 material on the surface that are used to make electrical contact between the elements on the co-fired ceramic module 121 and outside components and/or circuits.

Figure 2:
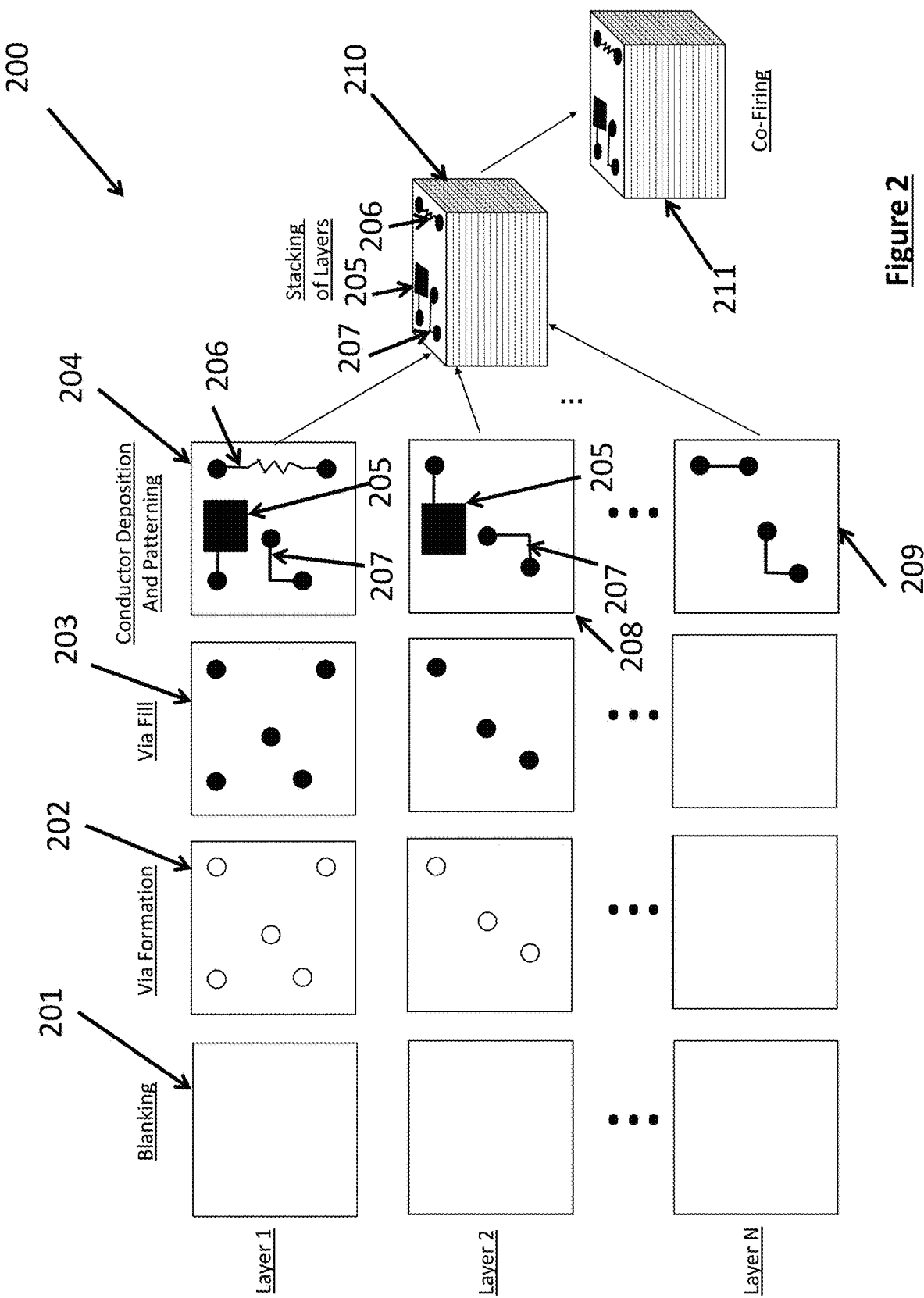
FIG. 2 illustrates the processing method of low-temperature co-fired ceramic (LTCC) to construct composite ceramic modules containing multilayer stacks of circuits according to an example of the present technology.

Through the use of the electrically-conductive filled vias and deposited and patterned electrically-conductive metal interconnects, a number of passive electrical components may be implemented such as resistors, capacitors, and inductors as shown in FIG. 2.

As seen in FIG. 2, there are some pre-determined numbers of green tape blank layers 201 wherein each of N layers may be individually processed and patterned as described above. The blank element 201 has openings or vias made into it of a pre-determined pattern as shown in blank 202. As before, there are N blank layers each of which can be individually processed and patterned. The patterned blank 202 then have a pre-determined pattern of openings or vias filled to form the further processed blank 203. Then, the further processed blank 203 has pre-determined pattern of passive electrical components screen-printed onto the surface of the blank 204. These can include passive electrical components such as resistors 206, inductors 207 and capacitors 205. The formation of the capacitors 205 and inductors 207 are shown implemented onto multiple layers of blanks 204, 208, and . . . 209. The individual processed blanks 204, 208, and . . . 209 are then aligned and stacked or laminated together 210. The stacked blanks 210 are then co-fired at an elevated temperature to transition the stacked layers of green tape into a ceramic composite element 211.

LTCC is useful for packaging of dies made using micro- or nano-fabrication techniques and can be used to form complete enclosures 300 for die or dies as shown in FIGS. 3A to 3F.

Figure 3A:
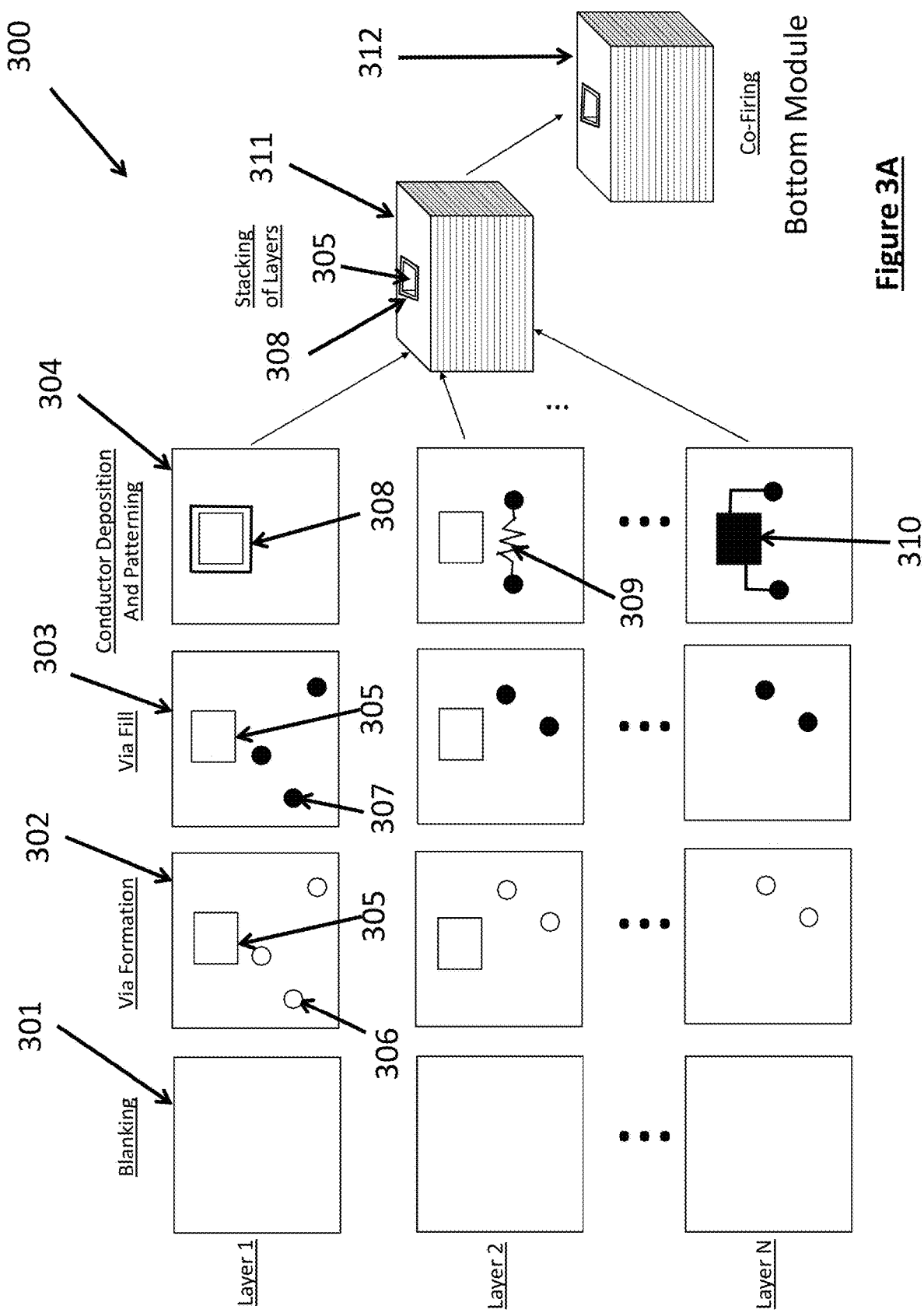

As shown in FIG. 3A, there are some pre-determined number of green tape blank layers 301 wherein each of N layers may be individually processed and patterned as described above. The blanks 301 have a pre-determined pattern of openings or vias 305 and 306 formed in them and some pre-determined number of them are not filled with an electrically conductive material resulting in open areas (e.g., via 305) and filled vias 307 in the blank layers 301. During the screen-printing, a metal ring 308 is formed around the perimeter of the open unfilled via 305 that will be used for bonding. Passive electrical components 309 including resistors and a metal bond pad 310 for die can be made in the blank layers according to a pre-determined design configuration using the methods described above. Capacitors and inductors are not shown in FIG. 3A, but can be made in the blank layers as described above. The blank layers are then aligned and stacked or laminated to form an LTCC green tape composite element 311 with the passive elements 309 and 310 contained within the composite element 311 and the metal bonding ring 308 on the top surface of the composite element 311. The composite element 311 is then exposed to an elevated temperature to co-fire the composite element 311 to transition the composite element 311 from a green tape to a ceramic composite element thereby forming the bottom module 312. The bottom module 312 contains pre-determined electrical wiring incorporated into the layers as well as any pre-determined passive components 309 according the pre-determined design configuration.

Figure 3B:
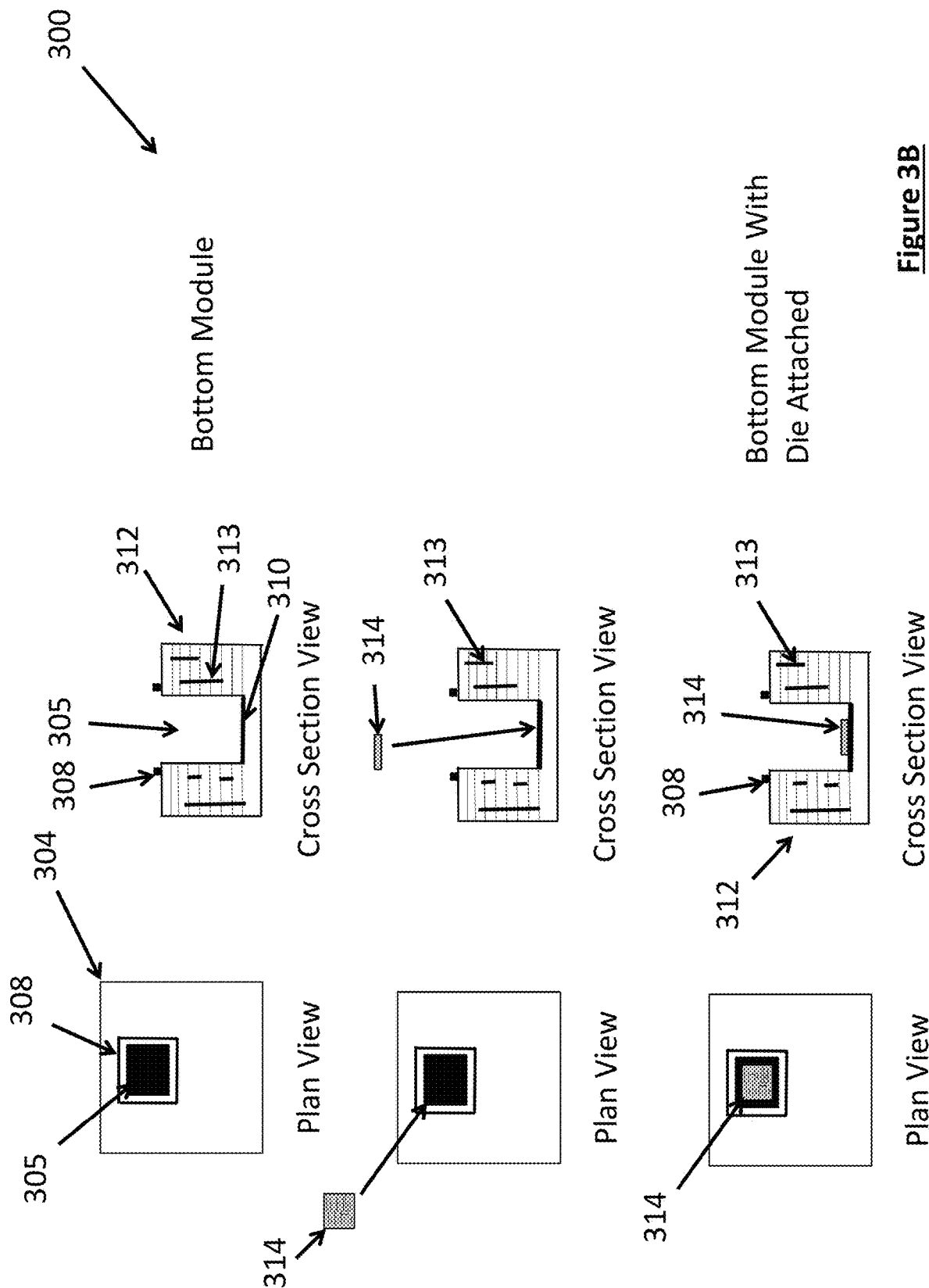

Next, as shown in FIG. 3B in both plan view and cross sectional view, the bottom module 312 with the electrical bond pad 310 exposed through the unfilled vias 305 through the LTCC layers 304 has a semiconductor die 314 containing micro- or nano-fabrication devices including active elements is bonded to the bonding pad 310 in the bottom module 312 thereby resulting in the bottom module 312 with the die 314 attached as shown at the bottom of FIG. 3B. The bonding can be done with an electrically conductive paste, thermo-compression bonding or similar.

Figure 3C:
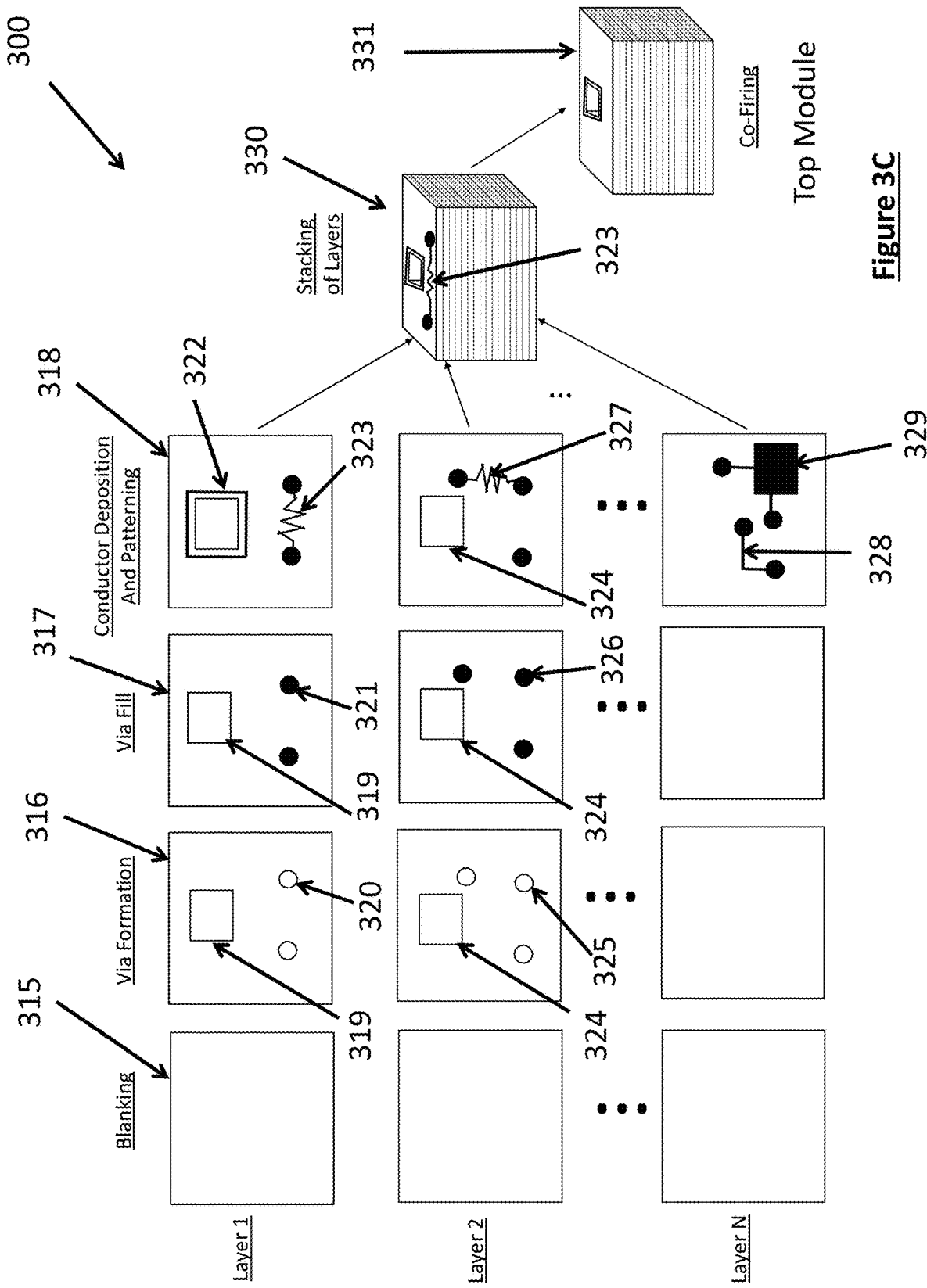

A top module 331 is implemented as shown in FIG. 3C. As before, the blank 315 green tape layers are patterned into pre-determined features of vias 319 and 320 resulting in patterned blank layers 316. Some pre-determined number of the patterned blank layer 316 openings or vias 320 are then filled with an electrically conductive material according to a pre-determined pattern 321 wherein some of the other openings or vias 319 may not be filled. Then, screen-printing of electrical features 323, 327, 328 and 329 are made on the top surfaces of the processed and patterned blank layers 318. These electrical features can include a bonding ring 322 as well as filled vias for electrical interconnects, and passive electrical components such as resistors 323 and 327, capacitors 329 and inductors 328. The N-number of individually processed green tape blank layers 318 are then aligned and stacked or laminated to form a composite element 330. Subsequently, the processed green tape composite element 330 is exposed to an elevated temperature to transition the green tape to a ceramic resulting in a ceramic composite element thereby resulting in the top module 331.

The top module 331 is shown in plan view and cross sectional view in FIG. 3D. As seen, it has an unfilled opening or via 319, various filled vias 332 that are electrically conductive, a bonding ring 322 around the perimeter of the unfilled opening or via 319 and passive components 323 and lateral electrical interconnection wiring (not shown in FIG. 3D) within the composite top module 331.

The top module 331 and bottom module 312 are then aligned (see cross sectional view FIG. 3E) and bonded together. The bonding ring 322 made on the surface of the top module 331 is aligned to physically contact with bonding ring 308 on the surface of the bottom module 312. A force or pressure loading and elevated temperature are applied to the physically contacted modules 312 and 331 to result in high-strength bonding between the modules 312 and 331 to form the bonded module 340 as shown in cross-sectional view in FIG. 3F.

As can be seen in the cross-sectional view of FIG. 3F, the die is completely encapsulated in the interior of a sealed cavity 341 within the two bonded modules 312 and 331 while the die is electrically connected to the outside of the packaging module 340 using internal electrical interconnections 313 and 332. The environment inside the cavity 341 is hermetically sealed and can be controlled depending on the ambient used during the bonding process. For example, by bonding the two modules 312 and 331 together while in a vacuum environment will allow the cavity 341 to be evacuated. Similarly, the bonding can be performed in an inert gas environment, such as nitrogen or argon, a lower or higher pressure environment, etc. depending on the requirements for the packaging of the micro- or nano-fabricated die 314.

A unique feature of LTCC technology is the availability of different ceramic materials. Ceramic green tapes are available with various thicknesses, loss tangents, dielectric constants, thermal expansions, and magnetic properties as well as dozens of metallization options including Au, Ag and their various alloys with Pt and Pd. As a result, LTCC material systems and material choices are much broader than most alternative material systems. LTCC material systems with dielectric constants ranging from 8 to over 80 are available.

Importantly, LTCC also has large cost advantages compared to other packaging methods. Current rule-of-thumb cost estimates are a few cents per square inch per layer with the cost decreasing each year as the technology matures and productive quantities increase. Consequently, LTCC not only provides exceptional performance and extremely high levels of functionality (more than 50 stacked and interconnected layers), but also vastly lower costs compared to other technologies that are currently available.

An embodiment of the present invention for the packaging of integrated microfluidic systems 400 using LTCC is shown in cross section in FIGS. 4A to 4D.

Figure 4A:
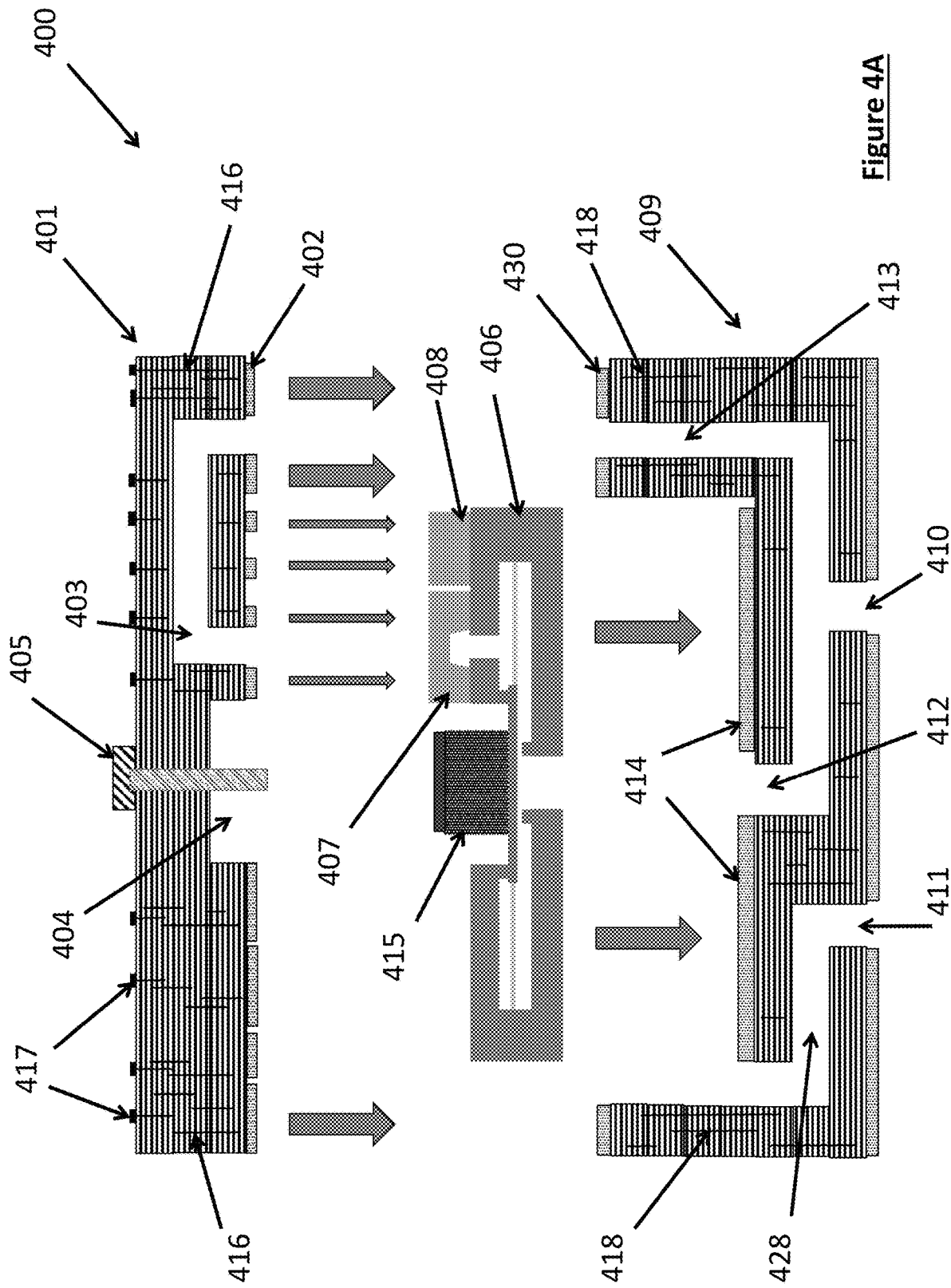
FIGS. 4A to 4D are cross sectional illustrations of packaging of integrated microfluidic systems using low-temperature co-fired ceramic (LTCC) according to an example of the present technology.

A top module 401 composed of LTCC is shown in the top of FIG. 4A. It is made using the processing and patterning of individual LTCC blank layers as described above to form microfluidic openings or cavities 404, microfluidic channels 403, electrical contact pads 417 on the top surface of the module 401, and electrical connections 416 both in the vertical and horizontal directions throughout the layers of the module 401. Additionally, materials 402 for bonding one module 401 to another have been deposited and patterned.

A microfabricated device 406 is also shown in the middle of FIG. 4A. This microfabricated device 406 is a three-way microvalve. It uses a piezoelectric actuator 415 to open and close the microvalve 406. The microvalve 406 top fluidic port has a pressure sensor 407 bonded over it to measure the fluidic pressure. A microfabricated electrical circuit die 408 is also bonded to the top surface of the microvalve 406 and is used to operate and control this integrated microfluidic system 406 and 407. In some examples of the present technology, vertical and horizontal electrical interconnections through LTCC layers of the plurality of LTCC layers to make electrical connections to the semiconductor device for supplying power, connect microfluidic components of the same or different semiconductor devices to one another, and provide for electrical signals to be transferred to and/or between the semiconductor devices, and/or to the outside of the microfluidic device.

A bottom module 409 for the packaging of the integrated microfluidic system 406 and 408 is also shown at the bottom of FIG. 4A. The bottom module 409 is made of LTCC layers as described previously and includes: microfluidic channels 413 and 428; microfluidic ports 410 and 411; an opening 412 where the microfluidic channel 413 connects to a microfluidic port on the bottom of the microvalve 406; bonding surfaces of conductive material layer 414 for the bonding of the integrated microfluidic system composed of the microvalve 406, pressure sensor 407 and electronics die 408, to the bottom module 409; bonding surfaces 430 for the bonding of the top module 401 and bottom module 409; and electrical interconnects 418 in both the vertical and horizontal directions in the LTCC layers of the bottom module 409.

Figure 4B:
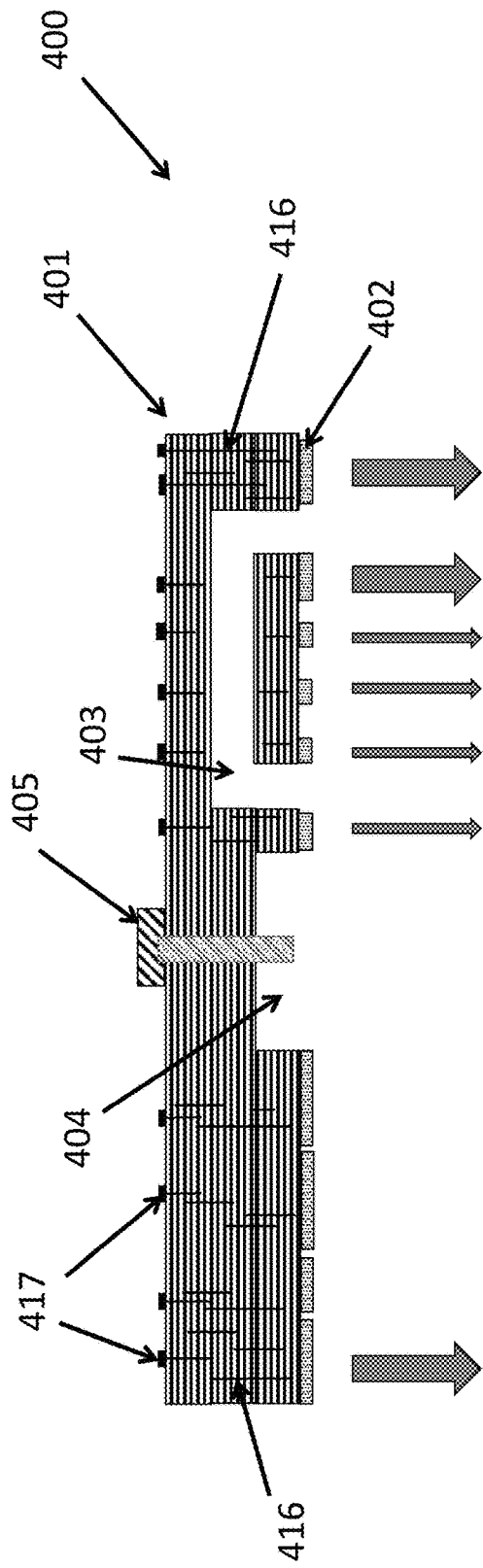
Figure 4B:
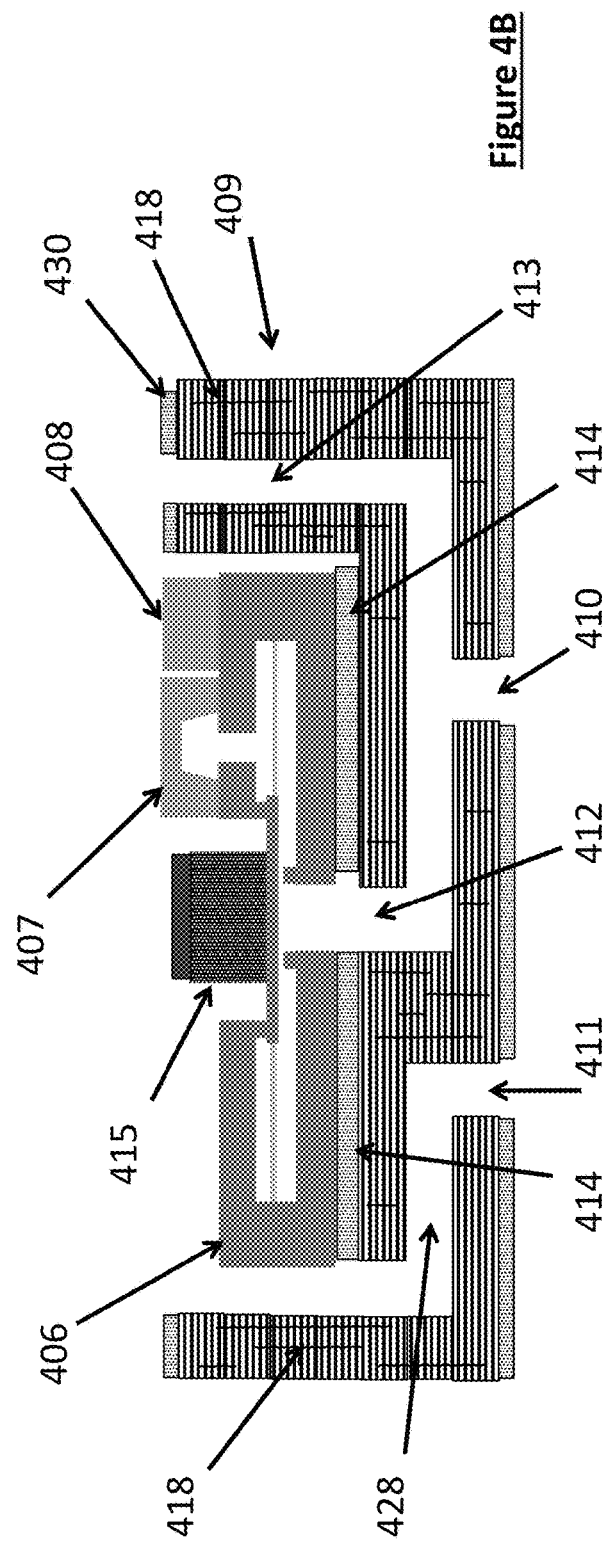

As shown in FIG. 4B, the integrated microfluidic system composed of the microvalve 406 and pressure sensor 407 and electronics die 408 is bonded to the bottom LTCC module 409 using the bonding material surface of the conductive material surface 414 made in the bottom module 409 insert. This bonding material can be a conductive paste, a thermo-compression bonding, or an epoxy or similar. If an electrically conductive material layer 414 is used for the bonding of the integrated microfluidic system composed of the microvalve 406 and pressure sensor 407 and electronics die 408, then the electrically conductive interconnects 418 made vertically and horizontally in the bottom module 409 can be used to electrically connect to the microfluidic system composed of the microvalve 406 and pressure sensor 407 and electronics die 408.

Figure 4C:
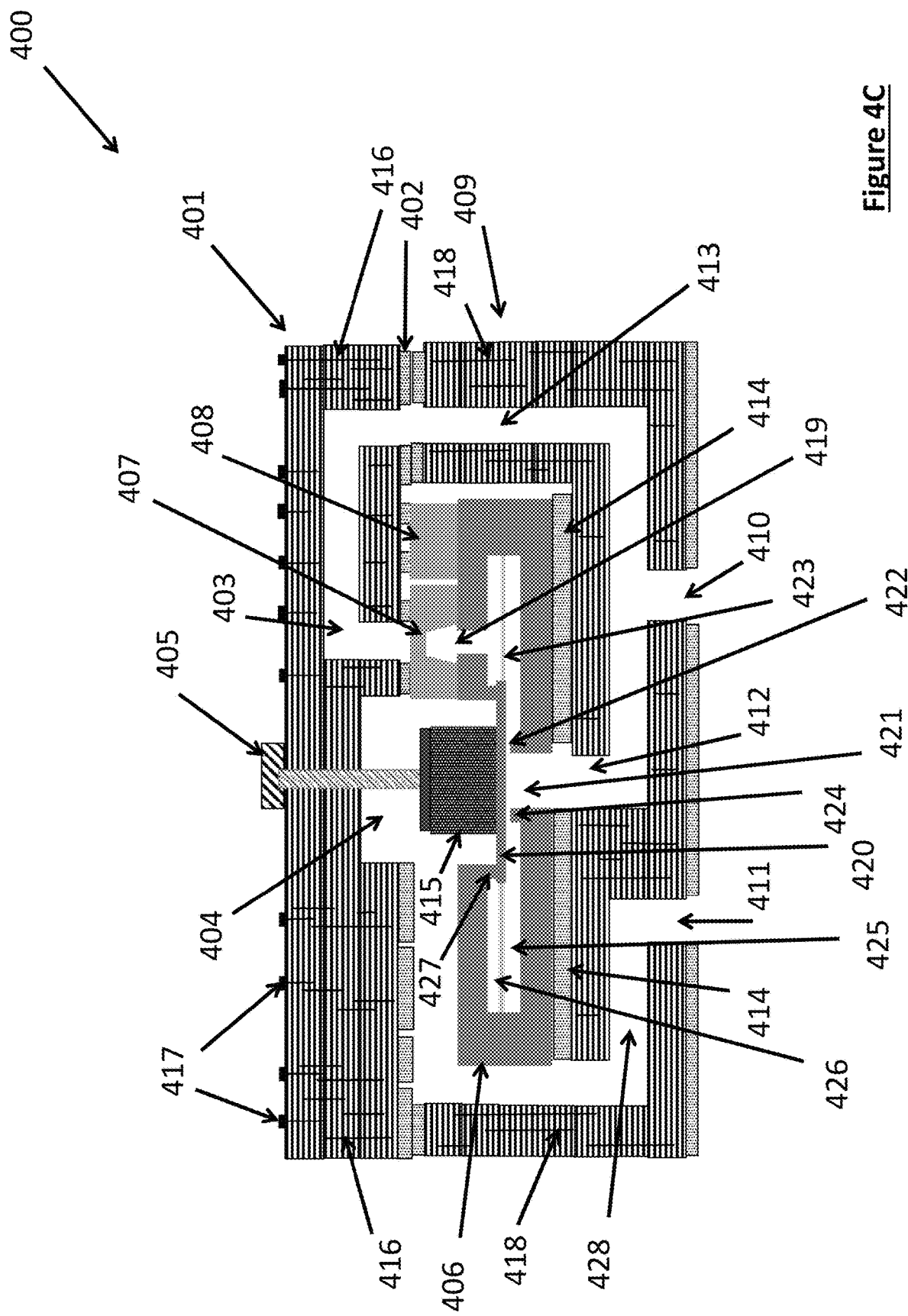

Next, as shown in FIG. 4C, the top module 401 is bonded to the bottom module 409. Depending on the nature of the microfluidic system, bonding may also be performed to one or more pre-determined elements of the microfluidic system, such as the microvalve 406, the pressure sensor 407 and the electronics die 408. In the case of FIG. 4C, bonding is done to the pressure sensor 407 and the electronics die 408 in order to make electrical contact to the top surfaces of these devices (e.g., pressure sensor 407 and electronic die 408) where electrical bond pads are located. In some other microfluidic system configurations, it may be desirable to bond to the top surface of the microvalve 406 in order to make electrical connection to the microvalve device 406. An adjustment fine-threaded screw 405 is available in the top module 401. This screw allows adjustment so that any distance from the top of the piezoelectric actuator 415 can be removed so that the actuator has a fixed surface to work against with the actuator 415 is actuated. One or more of the screws and/or other securing features may provide for an adjustment mechanisms to enable the removal of tolerances between one or more microfluidic devices and the package.

The result of the bonding of the top module 401 to the bottom module 409 and one or more elements of the microfluidic system 400 composed of the microvalve 406 and pressure sensor 407 and electronics die 408, is shown in FIG. 4C, thereby resulting in a packaged integrated microfluidic system 400. Herein the microfluidic system composed of the microvalve 406 and pressure sensor 407 and electronics die 408 are discrete devices made using non-LTCC materials, specifically, silicon or other semiconductor, or a type of glass, or a ceramic or metal.

From an operational standpoint, there are two inlet ports, a first inlet port 410 and a second inlet port 411, and one outlet port 419 that is sealed against the underside of the pressure sensor 407. When the piezoelectric actuator 415 is not actuated, that is, no voltage is applied to the piezoelectric actuator 415, the actuator does not apply force against the microvalve 406 movable plunger plate 420. In this state, fluid can flow into a first inlet port 410, branch into two directions along a first and second fluid channels 412 and 413. The fluid in the second channel 413 reaches the fluid channel 403 whereupon it contacts the top surface of the pressure sensor 407 and applies the pressure of the fluid upon the top surface of the pressure sensor 407. The other pathway of the fluid in the first channel enters the bottom port 421 of the microvalve 406 and flows through the opening 422 between the top surface of the sealing ring or sealing surface 424 and the bottom of the plunger plate 420 and then through the low chamber 425 of the microvalve 406 through openings in the microvalve moveable membrane 423, then through the upper chamber 426 of the microvalve 406, and outward of the top outlet port 419 of the microvalve 406. The fluid flowing though the top outlet port 419 of the microvalve 406 reaches the underside of the pressure sensor 407 and applies the fluid pressure to that surface. Since the fluid pressures applied to the top and bottom surfaces of the pressure sensor 407 are the same, no pressure differential is measured with the integrated microfluidic system composed of a microvalve 406, pressure sensor 407 and electronics die 408, in this state. The fluid entering the second inlet port 411 flows through the channel 428 and reaches the top of the plunger plate 420 of the microvalve 406. Since the plunger plate 420 is in contact with the top sealing rings or sealing surfaces 427, no fluid can flow through the microvalve 406 in this direction.

Figure 4D:
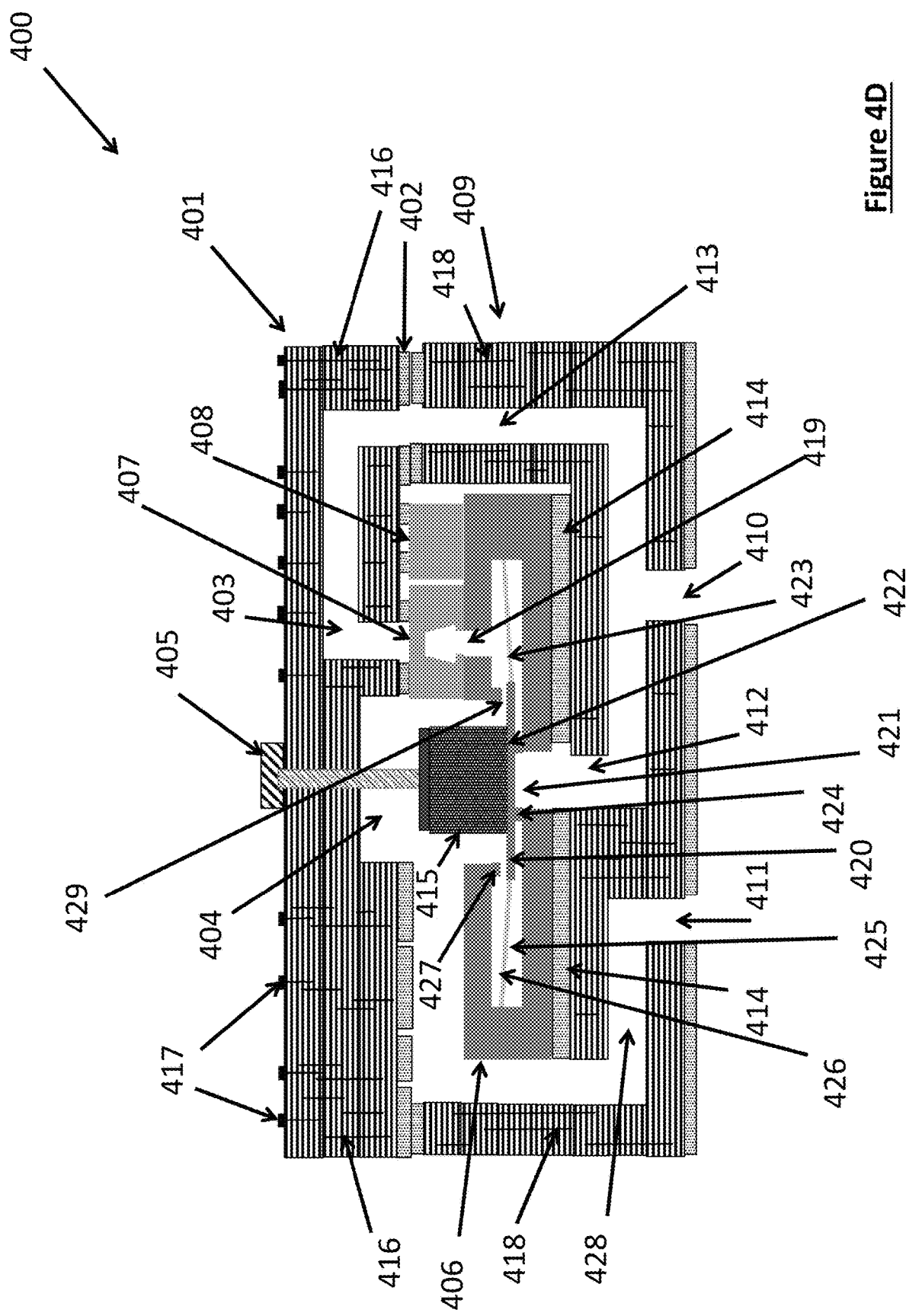

The second state of the integrated microvalve system composed of a microvalve 406, pressure sensor 407 and electronics die 408 in the package is described as shown in FIG. 4D. In the second state, a voltage is applied across the piezoelectric actuator 415 thereby causing it to elongate. When the piezoelectric actuator elongates, it applies a force to the plunger plate 420 that moves it so that the bottom of the plunger plate 420 is in contact with the top of the sealing rings or sealing surfaces 424. This closes the one of the inlet ports 421 to the microvalve 406 so that fluid cannot enter into the microvalve 406 lower chamber 425. As before, fluid enters into the first inlet port 410 of the package, flows through the channel 413 in the package, enters the channel 403 of the package whereupon it reaches the top surface of the pressure sensor 407, thereby applying the fluid pressure on the top surface of the pressure sensor 407. Fluid that enters the second inlet port 411 of the package enters flow channel 428, and reached the top of the moveable plunger plate 420 of the microvalve 406. Since the plunger plate 420 has been displaced by the piezoelectric actuator 415, it is in contact with the sealing rings or sealing surfaces 424 around microvalve port 421. Therefore, a gap 429 is created between the top of the plunger plate 420 and the sealing rings or sealing surfaces 427 thereby allowing fluid to pass through this gap 429. The fluid passing through this gap 429 enters into the top chamber 426 of the microvalve 406, and enters the outlet port 419 of the microvalve 406, and reaches the underside surface of the pressure sensor 407 thereby applying the fluid pressure to the bottom surface of the pressure sensor 407. Since the pressure sensor 407 can then measure if there is a difference in fluid pressures on either side of the pressure sensor 407 in this state.

Figure 5:
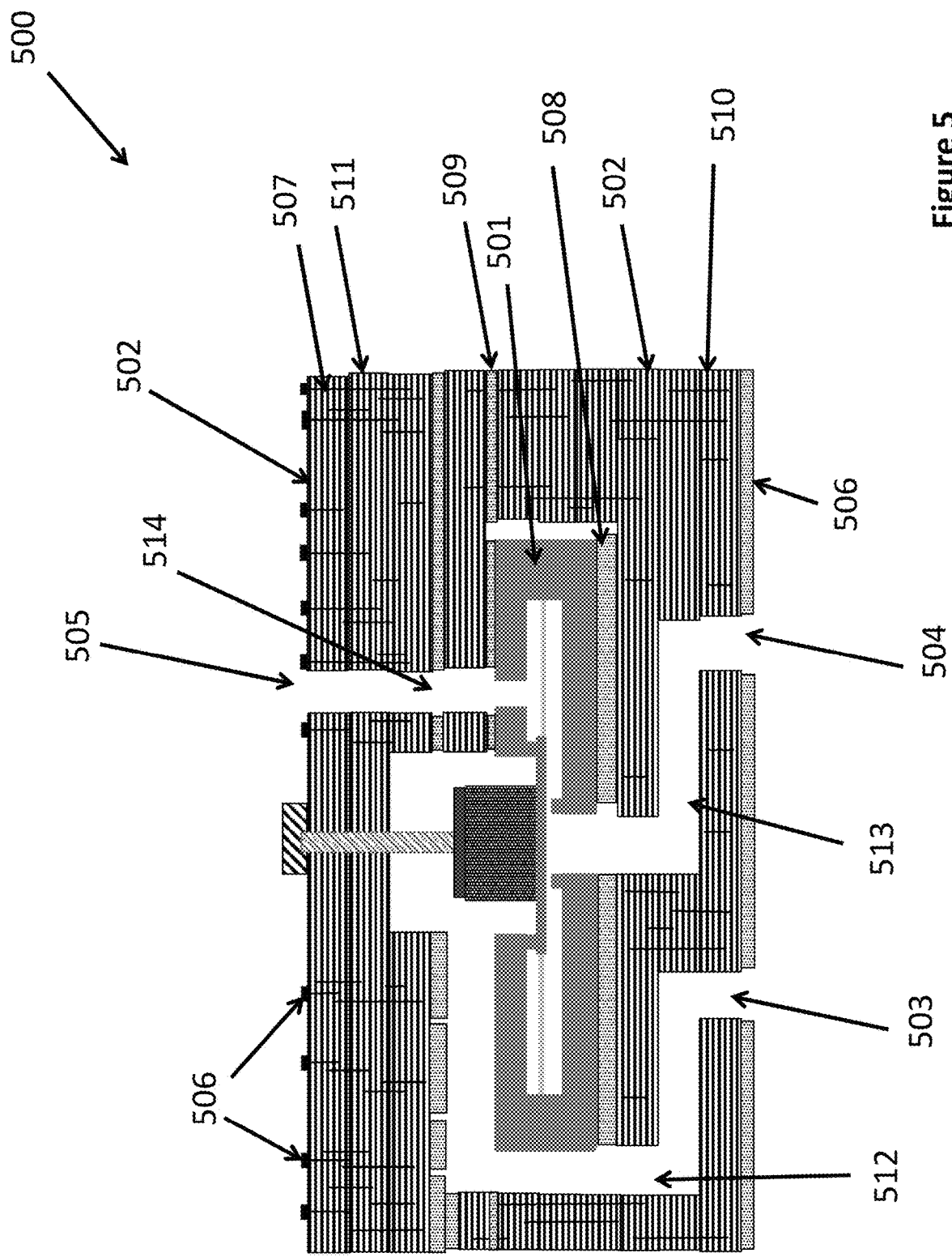
FIG. 5 is cross sectional illustration of packaging of integrated microfluidic systems using low-temperature co-fired ceramic (LTCC) according to another example of the present technology.

Another embodiment 500 of the present invention is shown in FIG. 5. A microvalve 501 device is shown in a package 502 using LTCC. As described above, the LTCC layers are made into a bottom module 510 that is bonded to the microvalve 501 using a material layer 508 wherein the fabrication processes of the blank layers of LTCC green tape are as described above and the layers are aligned and stacked together and then co-fired to transition them to a ceramic module 510. Additionally a top module 511 is made using the same techniques and then bonded to the bottom module 510 using the bonding material layers 509 to complete encapsulate and seal the microvalve 501 into the package 502. The LTCC bottom and top modules 510 and 511 have been implemented to incorporate fluid channels 512, 513 and 514, as well as the first inlet port 503, the second inlet port 504, and the outlet port 505. Electrical interconnects 507 are incorporated into the LTCC layers that run in both the vertical and horizontal directions. Electrical contact pads 506 are made onto the surfaces of the modules 510 and 511.

FIG. 6 illustrates steps of a method for fabrication a package for a microfluidic device or system made of a plurality of individually patterned layers of low-temperature co-fired ceramic (LTCC) material. While operations in FIG. 6 are shown in a specific order, one or more of the operations may be omitted, substituted by another operations, moved and/or repeated.

Fabricating the package for the microfluidic device or system made from individually patterned layers of low-temperature co-fired ceramic (LTCC) material may include: selecting a plurality of layers one of more layer of LTCC green tape of a pre-determined type, size and thickness (step 610); making openings of pre-determined sizes and shapes made through one or more LTCC green tape layers of the plurality of layers according to pre-determined patterns (step 620); selectively filling pre-defined openings in one or more LTCC green tape layers of the plurality of layers with an electrically conductive material to form vertical electrical connection pathways through the LTCC green tape layers (step 630); making pre-determined electrical connections with an electrically conductive material onto the surfaces of one or more the LTCC green tale layers of the plurality of layers to form horizontal electrical connection pathways across the LTCC green tape layers (step 640); making pre-determined types and sizes of passive electrical components with an electrically conductive material onto surfaces of one or more LTCC green tape layers of the plurality of layers (step 650); making pre-determined features of openings made through the a thickness of one or more LTCC green tape layers of the plurality of layers to partially form portions of a fluid handling channels (step 650); making pre-determined open features through a thickness of the one or more LTCC green tape layers of the plurality of layers to form fluidic inlet and outlet ports (step 660); making one or more layers materials with pre-determined patterned features on surfaces of one or more LTCC green tape layers of the plurality of layers to facilitate bonding (step 670); and/or alighting and stacking pre-determined LTCC green tape layers of the plurality of layers to form a first packaging module and/or alighting and stacking pre-determined LTCC green tape layers of the plurality of layers to form a second packaging module (step 680).

The method may also include exposing the first and second packaging modules to an elevated temperature to transition the LTCC green tape material of the plurality of layers to a stable form of ceramic LTCC material (step 690); aligning and bonding one or more device dies onto pre-determined surfaces within the first and/or second packaging modules (step 700); and/or alighting and bonding at least the pre-determined surfaces of the first packaging module and the second packaging module to form an encapsulated and sealed package enclosure for the one or more device dies (step 710).

While the example embodiments are described with references to a first and second packaging module being aligned and bonded, examples of the present technology are not so limited. In some examples, one or more additional packaging modules may be bonded to inside and/or outside surface of the package formed by the first and second packaging modules. In some examples, more than two packaging modules may be aligned and bonded to form a single encapsulated and sealed package enclosure. In some examples, a plurality of packaging modules may be aligned and bonded to form multiple encapsulated and sealed enclosures with each enclosure including one or more device dies, which may or may not be connected electrically (e.g., via wiring) and/or mechanically (e.g., via fluidic channels) to each other through the bonded surfaces of the packaging modules.

In some examples of the present technology, a package for a microfluidic devices and systems made from individually patterned layers of low-temperature co-fired ceramic (LTCC) material may include: LTCC green tape layers having openings of pre-determined sizes and shapes made through the layers according to pre-determined patterns; LTCC green tape layers having pre-defined openings that are selectively filled with an electrically conductive material to form vertical electrical connection pathways through the LTCC green tape layers; LTCC green tape layers having pre-determined electrical connections made with an electrically conductive material deposited onto the surfaces of the LTCC green tape layers to form horizontal electrical connection pathways across LTCC green tape layers; LTCC green tape layers having pre-determined types and sizes of passive electrical components made with an electrically conductive material onto the surfaces of the LTCC green tape layers; LTCC green tape layers having pre-determined features of openings made through the thickness of the layers to partially form portions of a fluid handling channels; LTCC green tape layers having pre-determined open features made through the thickness of the layers to form fluidic inlet and outlet ports; and/or LTCC green tape layers having pre-determined features of materials patterned on the surfaces of the layers to facilitate bonding. Two or more of the LTCC green tape layers may be aligned and stacked to form one or more packaging modules (e.g., a first packaging module and/or a second packaging module. The packaging modules may be exposed to an elevated temperature to transition the LTCC green tape to a stable form of LTCC ceramic material.

In some examples, the package may include one or more device dies and/or one or more integrated microfluidic system device dies aligned and bonded to pre-determined surfaces within one or more of the packaging modules. The one or more of the packaging modules may be bonded at pre-determined surface to form an encapsulated and sealed packaging enclosure for the one or more device dies and/or one or more integrated microfluidic system device dies.

In some examples of the present technology: the device die includes one or more of: a microvalve; a micropump; a mixer; a chemical reaction chamber; a check valve; a pressure sensor; a flow sensor; a temperature sensor; a chemical sensor; a biological sensor; a flow resistor; a flow integrator; a shear stress sensor; a material property sensor; a magnetic sensor; an electromagnetic sensor; a thermal sensor; and/or a hall effect sensors; as well as any device that can be implemented using semiconductor fabrication techniques.

In some examples of the present technology: the device die can include: an integrated electronic circuit, a photonic circuit; an active electronic and photonic device; a transistor; a diode; a photodiode; a photodetector; and/or an emitters; as well as any device that can be implemented using semiconductor fabrication techniques.

In some examples of the present technology: (a) one or more of the first to seventh LTCC green tape layers include passive components disposed on surfaces having pre-determined values of resistance, capacitance and/or inductance; (b) the package may include microfluidic components including seals between bonding surfaces within the package; (c) an interior of the package may be sealed and have a controlled environment; (d) pre-determined vertical and horizontal electrical interconnections may be provided through at least a portion of the LTCC layers to provide electrical connections to microfluidic components for supplying power, connect the microfluidic components to one another, and/or run electrical signals from the microfluidic components to an outside of the package; (e) the microfluidic devices and other components may be bonded to the first and/or second modules with an electrically conductive material; (f) the microfluidic devices and other components may be bonded to the first and/or second modules using thermo-compression bonding with an electrically conductive intermediary layer; (g) the package may include inlet and outlet ports sized and shaped to facilitate making fluidic connections to the inlet and outlet ports; (h) the package further comprises one or more adjustment mechanisms to enable the removal of tolerances between one or more microfluidic devices and the package; and/or (i) the electrical connections made in the layers extend to exterior surfaces of the package.

It should be understood and appreciated from the disclosures provided above that the content and extent of the present invention is limited only by the embodiments taught herein. Specifically, the use of LTCC for the packaging of individual microfluidic elements is disclosed in the above teachings, as well as more than one microfluidic discrete elements are also disclosed While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A package for a microfluidic device, comprising
   first low-temperature co-fired ceramic (LTCC) green tape layers having openings of pre-determined sizes and shapes made through the first LTCC layers according to pre-determined patterns;
   second LTCC green tape layers having pre-defined openings that are selectively filled with an electrically conductive material to form vertical electrical connection pathways through the second LTCC green tape layers;
   third LTCC green tape layers having pre-determined electrical connections made with an electrically conductive material deposited onto the surfaces of the third LTCC green tape layers to form horizontal electrical connection pathways across the third LTCC green tape layers;
   fourth LTCC green tape layers having pre-determined types and sizes of passive electrical components made with an electrically conductive material onto the surfaces of the fourth LTCC green tape layers;
   fifth LTCC green tape layers having pre-determined features of openings made through a thickness of the fifth LTCC green tape layers to partially form portions of a fluid handling channels;
   sixth LTCC green tape layers having pre-determined open features made through a thickness of the sixth LTCC green tape layers to form fluidic inlet and outlet ports;
   seventh LTCC green tape layers having pre-determined features of materials patterned on the surfaces of the seventh LTCC green tape layers to facilitate bonding,
   wherein two or more of the first to seventh LTCC green tape layers are aligned and stacked to form a first packaging module based on being exposed to an elevated temperature to transition the LTCC green tape of the first packaging module to a stable form of LTCC ceramic material,
   wherein two or more of the first to seventh LTCC green tape layers are aligned and stacked to form a second packaging module based on being exposed to the elevated temperature to transition the LTCC green tape of the second packaging module to a stable form of LTCC ceramic material,
   one or more device dies is disposed onto pre-determined surfaces within the first packaging module and/or the second packaging module, and
   the one or more pre-determined surfaces of the first packaging module is bonded to one or more surfaces of the second packaging module to form an encapsulated and sealed package enclosure for the one or more device dies.

2. The package of claim 1, wherein the device die includes one or more of: a microvalve; a micropump; a mixer; a chemical reaction chamber; a check valve; a pressure sensor; a flow sensor; a temperature sensor; a chemical sensor; a biological sensor; a flow resistor; a flow integrator; a shear stress sensor; a material property sensor; a magnetic sensor; an electromagnetic sensor; a thermal sensor; and/or a hall effect sensor.

3. The package of claim 1, wherein the device die includes one or more of: an integrated electronic circuit, a photonic circuit; an active electronic and photonic device; a transistor; a diode; a photodiode; a photodetector; and/or an emitter.

4. The packaging of claim 1, wherein one or more of the first to seventh LTCC green tape layers include passive components disposed on surfaces having pre-determined values of resistance, capacitance and/or inductance.

5. The package of claim 1, further comprising microfluidic components including seals between bonding surfaces within the package.

6. The package of claim 1, wherein an interior of the package is sealed and has a controlled environment.

7. The package of claim 1, further comprising pre-determined vertical and horizontal electrical interconnections through at least a portion of the LTCC layers to provide electrical connections to microfluidic components for supplying power, connect the microfluidic components to one another, and/or run electrical signals from the microfluidic components to an outside of the package.

8. The package of claim 7, wherein the microfluidic devices and other components are bonded to the first and/or second modules with an electrically conductive material.

9. The package of claim 7, wherein the microfluidic devices and other components are bonded to the first and/or second modules using thermo-compression bonding with an electrically conductive intermediary layer.

10. The package of claim 1, wherein the package includes inlet and outlet ports sized and shaped to facilitate making fluidic connections to the inlet and outlet ports.

11. The package of claim 1, further comprising one or more adjustment mechanisms to enable the removal of tolerances between one or more microfluidic devices and the package.

12. The package of claim 7, wherein the electrical connections made in the layers extend to exterior surfaces of the package.

13. A package for an integrated microfluidic system, comprising:
   first low-temperature co-fired ceramic (LTCC) green tape layers having openings of pre-determined sizes and shapes made through the first LTCC layers according to pre-determined patterns;
   second LTCC green tape layers having pre-defined openings that are selectively filled with an electrically conductive material to form vertical electrical connection pathways through the second LTCC green tape layers;
   third LTCC green tape layers having pre-determined electrical connections made with an electrically conductive material deposited onto the surfaces of the third LTCC green tape layers to form horizontal electrical connection pathways across the third LTCC green tape layers;
   fourth LTCC green tape layers having pre-determined types and sizes of passive electrical components made with an electrically conductive material onto the surfaces of the fourth LTCC green tape layers;

fifth LTCC green tape layers having pre-determined features of openings made through a thickness of the fifth LTCC green tape layers to partially form portions of a fluid handling channels;

sixth LTCC green tape layers having pre-determined open features made through the a of the sixth LTCC green tape layers to form fluidic inlet and outlet ports;

seventh LTCC green tape layers having pre-determined features of materials patterned on the surfaces of the seventh LTCC green tape layers to facilitate bonding, wherein two or more of the first to seventh LTCC green tape layers are aligned and stacked to form a first packaging module based on being exposed to an elevated temperature to transition the LTCC green tape of the first packaging module to a stable form of LTCC ceramic material, wherein two or more of the first to seventh LTCC green tape layers are aligned and stacked to form a second packaging module based on being exposed to the elevated temperature to transition the LTCC green tape of the second packaging module to a stable form of LTCC ceramic material, one or more integrated microfluidic system device dies is disposed onto pre-determined surfaces within the first packaging module and/or the second packaging module, and the one or more pre-determined surfaces of the first packaging module is bonded to one or more surfaces of the second packaging module to form an encapsulated and sealed package enclosure for the one or more integrated microfluidic system device dies.

\* \* \* \* \*